() United States Patent (10) Patent No.: US 7,329,942 B2
Tsou et al. (45) Date of Patent: Feb. 12, 2008

(54) ARRAY-TYPE MODULARIZED LIGHT-EMITTING DIODE STRUCTURE AND A METHOD FOR PACKAGING THE STRUCTURE

(76) Inventors: Ching-Fu Tsou, No. 20, Lane 72, Dafong E. 3rd St., Tanzih Township, Taichung County 427 (TW); I-Ju Chen, 4F.-2, No. 25-2, Lane 510, Minsheng S. Rd., Chiayi City 600 (TW); Yeh-Chin Chao, 2F., No. 31, Alley 57, lane 271, Wuling Rd., Hsinchu City 300 (TW)

( * ) Notice: Subject to any disclaimer, the term of this patent is extended or adjusted under 35 U.S.C. 154(b) by 4 days.

(21) Appl. No.: 11/131,395

(22) Filed: May 18, 2005

(65) Prior Publication Data

US 2006/0261357 A1 Nov. 23, 2006

(51) Int. Cl.
*H01L 31/00* (2006.01)
*H01L 27/15* (2006.01)
*H01L 33/00* (2006.01)
*H01L 23/58* (2006.01)

(52) U.S. Cl. .................. 257/594; 257/53; 257/79; 257/81; 257/82; 257/83; 257/84; 257/85; 257/86; 257/87; 257/88; 257/98; 257/113; 257/117

(58) Field of Classification Search ............... None
See application file for complete search history.

(56) References Cited

U.S. PATENT DOCUMENTS

| 5,298,768 A * | 3/1994 | Okazaki et al. ............ 257/81 |
| 6,252,252 B1 * | 6/2001 | Kunii et al. ............... 257/81 |
| 6,295,031 B1 * | 9/2001 | Wallace et al. ............ 343/702 |
| 6,486,543 B1 * | 11/2002 | Sano et al. ............... 257/684 |
| 6,518,656 B1 * | 2/2003 | Nakayama et al. ......... 257/680 |
| 6,531,328 B1 * | 3/2003 | Chen ......................... 438/26 |
| 6,864,570 B2 * | 3/2005 | Smith ........................ 257/703 |
| 6,874,910 B2 * | 4/2005 | Sugimoto et al. .......... 362/294 |
| 7,008,240 B1 * | 3/2006 | Wang et al. ................ 439/76.1 |
| 7,095,053 B2 * | 8/2006 | Mazzochette et al. ....... 257/81 |
| RE39,261 E * | 9/2006 | Floyd et al. ................ 359/201 |
| 2002/0163006 A1 * | 11/2002 | Yoganandan et al. ........ 257/81 |
| 2005/0181641 A1 * | 8/2005 | Hermanns et al. .......... 439/66 |
| 2005/0218801 A1 * | 10/2005 | Hon et al. .................. 313/512 |
| 2005/0224828 A1 * | 10/2005 | Oon et al. .................. 257/99 |
| 2005/0255628 A1 * | 11/2005 | Kinsman ..................... 438/64 |
| 2006/0006463 A1 * | 1/2006 | Islam et al. ................ 257/347 |
| 2006/0208271 A1 * | 9/2006 | Kim et al. .................. 257/100 |

* cited by examiner

*Primary Examiner*—Michael Lebentritt
*Assistant Examiner*—James M Mitchell
(74) *Attorney, Agent, or Firm*—Rosenberg, Klein & Lee

(57) ABSTRACT

An array-type modularized light-emitting diode structure and a method for packaging the structure. The array-type modularized light-emitting diode structure includes a lower substrate and an upper substrate fixed on the lower substrate. A material with high heat conductivity is selected as the material of the upper substrate. The upper substrate is formed with multiple arrayed dents and through holes on the bottom of each dent. A material with high heat conductivity is selected as the material of the lower substrate. The surface of the lower substrate is formed with a predetermined circuit layout card. The bottom face of the upper substrate is placed on the upper face of the lower substrate with the through holes of the dents respectively corresponding to the contact electrodes of the circuit layout card of the lower substrate. Multiple light-emitting diode crystallites are respectively fixed on the bottoms of the dents. Via the through holes, the electrodes of the light-emitting diode crystallites are electrically connected with the contact electrodes. Then the dents of the upper substrate are sealed to prevent the light-emitting diode crystallites from being oxidized.

3 Claims, 10 Drawing Sheets

ARRAY-TYPE MODULARIZED LIGHT-EMITTING DIODE STRUCTURE AND A METHOD FOR PACKAGING THE STRUCTURE

BACKGROUND OF THE INVENTION

The present invention is related to an array-type modularized light-emitting diode structure and a method for packaging the structure. In the modularized light-emitting diode structure, multiple light-emitting diodes are arranged in an array.

FIG. 14 shows the packaging structure of a conventional light-emitting diode. The bottom electrode 61 of the light-emitting diode crystallite 6 is electrically adhered to a first metal electrode layer 62. The top electrode 61 of the light-emitting diode crystallite 6 via a conductive wire 66 is connected to another first metal electrode layer 62. The two first metal electrode layers 62 are both disposed on upper face 71 of a fiberglass substrate 7 and respectively connected to two second metal electrode layers 63 under lower face 73 of the fiberglass substrate 7 through perforations 72. Each light-emitting diode crystallite 6 is surrounded by a bowl-shaped reflective board 64 for focusing and upward reflecting the light emitted by the light-emitting diode crystallite 6. The bowl-shaped reflective board 64 is enclosed by a packaging resin layer 65 for protecting the light-emitting diode crystallite 6 and the conductive wire 66. Then the structure is cut along the center of the perforation 72.

When emitting light, the light-emitting diode will generate heat. Therefore, the lighting efficiency of the light-emitting diode is affected by the heat dissipating capability. The substrate 7 of the packaging structure of the conventional light-emitting diode is an insulator having poor heat dissipating capability. Moreover, the substrate 7 is enclosed by the first metal electrode layers 62 and second metal electrode layers 63. Therefore, it is hard for the heat generated by the light-emitting diode to dissipate from the substrate 7. The heat can only partially dissipate via the metal electrode layers 62, 63 exposed to outer side of the packaging resin layer 65. Therefore, the heat dissipation effect is very poor.

In order to solve the above problem, another type of packaging structure of light-emitting diode has been developed as shown in FIG. 15. A silicon chip serves as a substrate 8 which is formed with a depression 81 by means of exposure and development and wet etching. Then the bottom of the depression 81 is formed with two electrode guide through holes 82 by means of dry etching or laser. Then an insulating layer is formed on the surface of the substrate 8 by means of oxidization or nitrification. Then a metal layer is deposited on the insulating layer to form a metal electrode 811 and a reflective layer 812 in the depression 81 and form a back electrode layer 813 on the back face of the substrate 8. The metal electrode 811 in the depression is cut into positive and negative electrode faces by means of laser. Then, the light-emitting diode crystallite 9 is placed on the positive electrode face in the depression 81 and connected to the negative electrode face via a conductive wire 91. Then the depression 81 is point-packaged by resin. Finally, the structure is cut along a line between two depressions 81.

The substrate 8 is a silicon chip which has better heat dissipating effect. Moreover, the depression 81 in which the light-emitting diode crystallite 9 is placed is directly formed in the substrate 8 so that the heat generated by the light-emitting diode crystallite 9 can be directly dissipated from the substrate 8 to achieve better heat dissipating effect.

However, the manufacturing procedure of such packaging structure of light-emitting diode is quite complicated. The surface of the substrate 8 must be first formed with the depression 81 by means of wet etching. Then the back face of the substrate 8 is formed with the electrode guide through holes 82 by means of dry etching or laser, which through holes 82 pass through the bottom of the depression 81. Then the insulating layer is formed on the surface of the substrate 8. Then the metal layer is deposited on the insulating layer to form the metal electrode and reflective layer in the depression. Then the metal electrode is cut into positive and negative electrode faces by means of laser. Especially, when making the electrode guide through holes 82, it is necessary to form the electrode guide through holes 82 of the depressions 81 one by one. Mass-production is impossible so that the manufacturing cost is greatly increased.

Furthermore, the above packaging structures of the light-emitting diode are mainly used to manufacture single light-emitting diode. Such packaging structures are not applicable to array-type modularized structure. In array-type light-emitting diodes, the entire layout and convenience in electric connection with outer side must be considered. The above packaging structures of light-emitting diode both lack layout design adapted to modularization. Therefore, it is impossible to manufacture array-type modularized structure.

SUMMARY OF THE INVENTION

It is therefore a primary object of the present invention to provide an array-type modularized light-emitting diode structure and a method for packaging the structure. The array-type modularized light-emitting diode structure includes a lower substrate and an upper substrate fixed on the lower substrate. A material with high heat conductivity is selected as the material of the upper substrate. By means of one of molding, injection molding and etching, the upper substrate being made from the material to have multiple arrayed dents and at least two through holes passing through the bottom of each dent. A material with high heat conductivity is selected as the material of the lower substrate. By means of one of halftone printing and etching, a surface of the lower substrate is formed with a predetermined circuit layout card. The bottom face of the upper substrate is fixed on the upper face of the lower substrate with the through holes of the dents of the upper substrate respectively corresponding to the contact electrodes of the circuit layout card of the lower substrate. The connecting sections of the circuit layout card are exposed to the periphery of the upper substrate. Multiple light-emitting diode crystallites are respectively fixed on the bottoms of the dents of the upper substrate. Via the through holes of the bottoms of the dents, the electrodes of the light-emitting diode crystallites are electrically connected with the contact electrodes of the circuit layout card of the lower substrate. Then the dents of the upper substrate are sealed to prevent the light-emitting diode crystallites from being oxidized. The material of the upper and lower substrate is a material with high heat conductivity and the light-emitting diode crystallites are fixed on the bottoms of the dents of the upper substrate. The heat generated by the light-emitting diode crystallites can dissipate from the upper and lower substrates so that the heat-dissipating effect is better. Accordingly, the lighting efficiency of the light-emitting diode can be enhanced.

It is a further object of the present invention to provide the above array-type modularized light-emitting diode structure and the method for packaging the structure. Multiple light-emitting diodes are arrayed and modularized so that the present invention is applicable to those products necessitating modularized light-emitting diodes, such as car headlight, traffic sign and liquid crystal display panel. Moreover, via the circuit layout card of the lower substrate, the electrodes of the light-emitting diodes are guided to the periphery of the lower substrate for easily manufacturing the leads for connecting with outer side. This facilitates the successive packaging of the entire module.

The present invention can be best understood through the following description and accompanying drawings wherein:

DETAILED DESCRIPTION OF THE PREFERRED EMBODIMENTS

Figure 1:
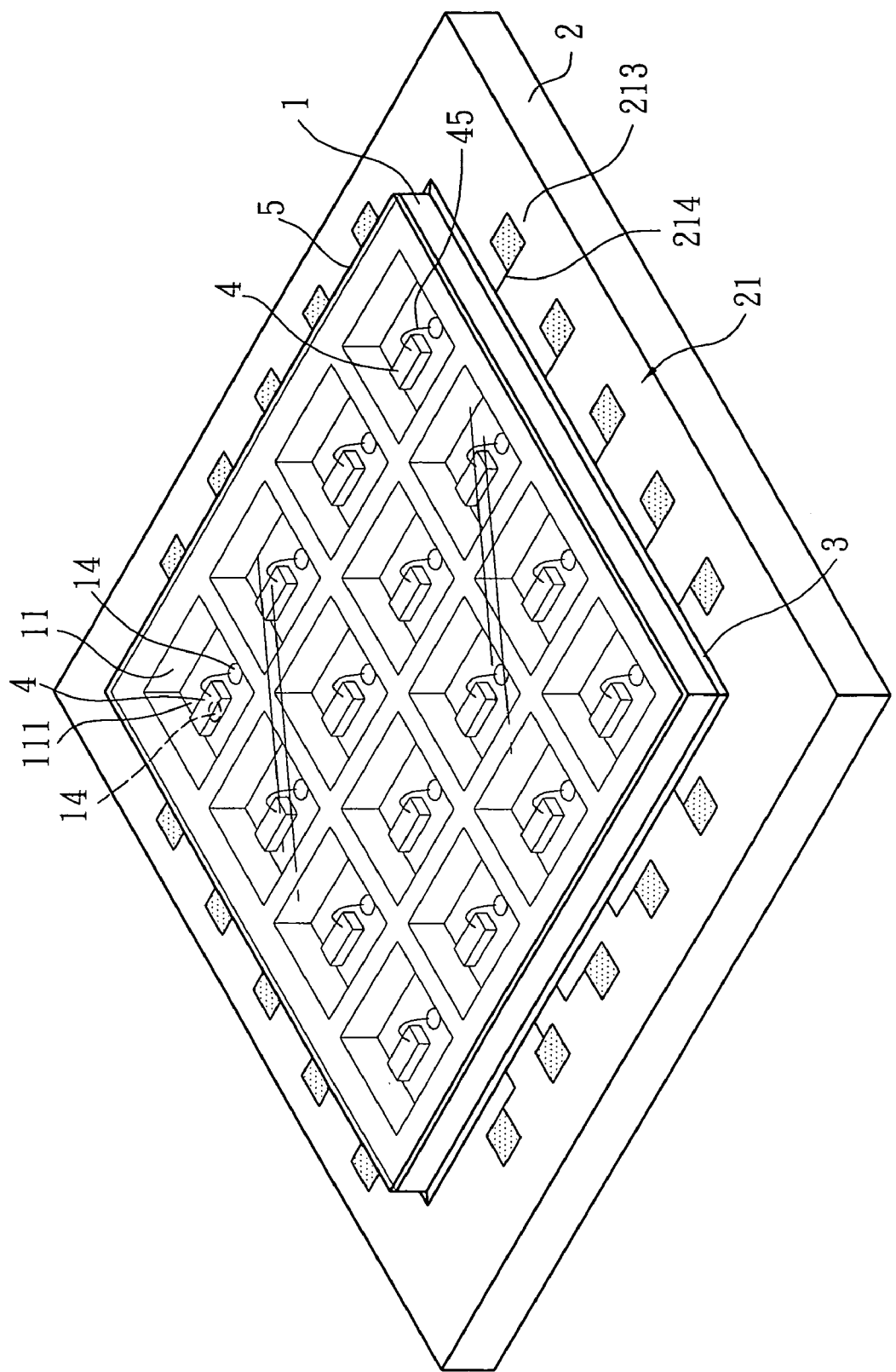
FIG. 1 is a perspective view of the modularized structure of the present invention.
Figure 2:
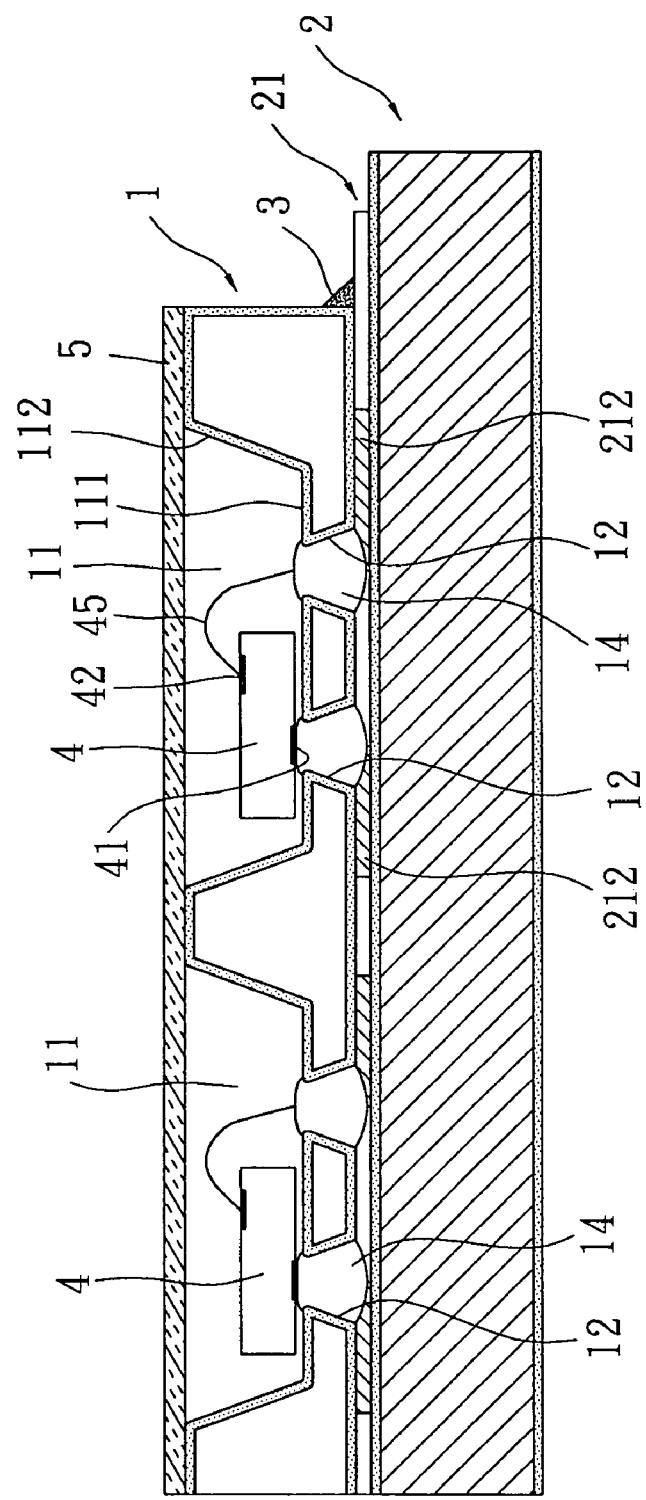
FIG. 2 is a sectional view of a part of the modularized structure of the present invention.
Figure 3:
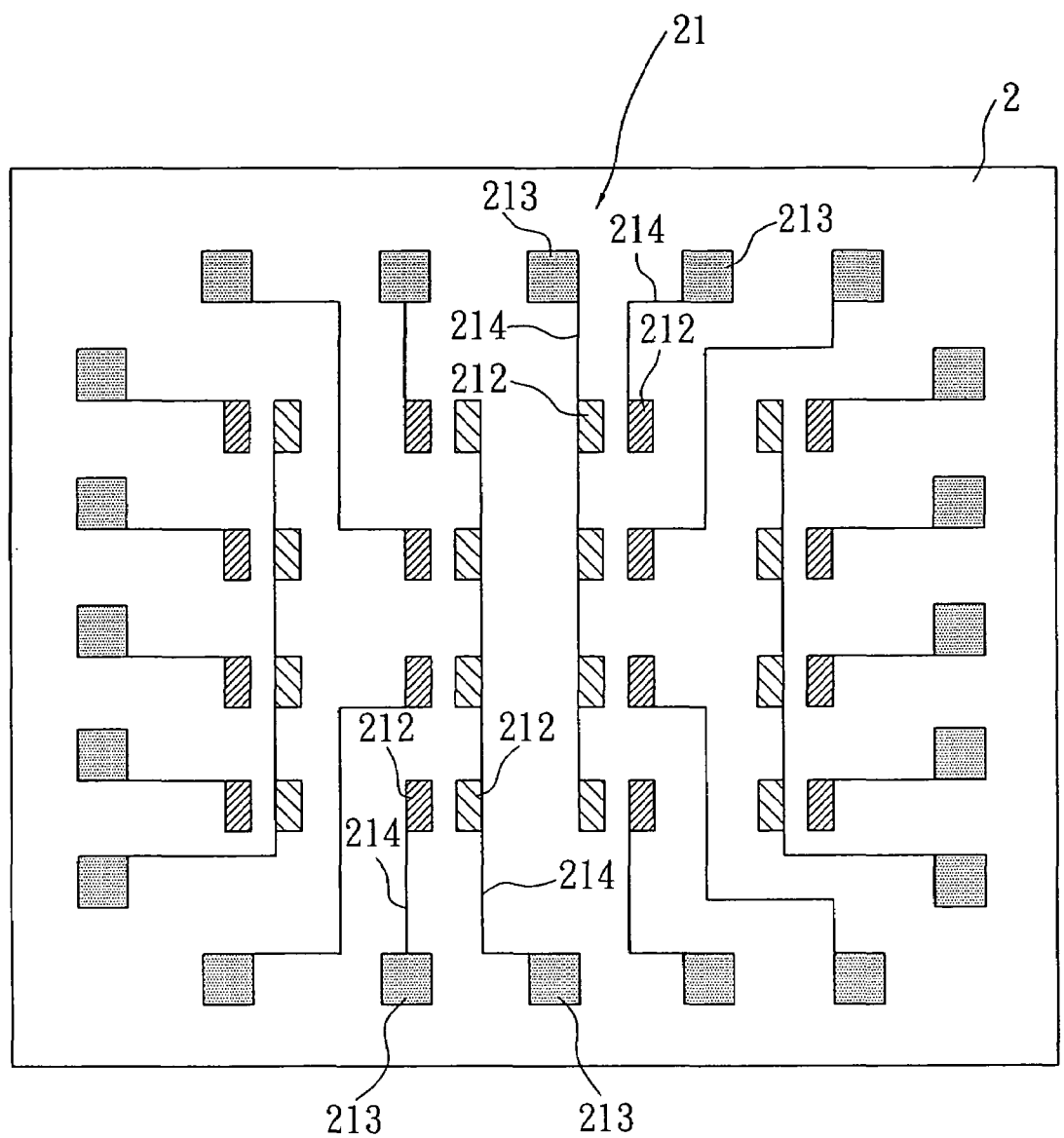
FIG. 3 is a diagram showing the circuit layout card of the lower substrate of the present invention.

Please refer to FIGS. 1 to 3. The array-type modularized light-emitting diode structure of the present invention includes a lower substrate 2 and an upper substrate 1 fixed on a surface of the lower substrate 2.

The upper substrate 1 has a certain high heat conductivity. Multiple arrayed dents 11 are formed in the upper substrate 1. In this embodiment, multiple dents 11 are formed in the upper substrate 1 and arranged in a 4×4 array. Each dent 11 has a wall 112 inclined by a certain angle, whereby the dent 11 is tapered for enhancing reflection effect. Alternatively, the wall 112 of the dent 11 can be vertical or round. Each dent 11 has a bottom 111 formed with at least two through holes 12 passing through the bottom 111. A conductive material 14 is disposed in each through hole 12. At least one light-emitting diode crystallite 4 is fixed on the bottom 111 of each dent 11. Each light-emitting diode crystallite 4 has two electrodes 41, 42. The dents 11 of the upper substrate 1 are sealed to protect the light-emitting diode crystallites 4 from being oxidized.

The lower substrate 2 has a certain high heat conductivity. A surface of the lower substrate 2 is formed with a predetermined circuit layout card 21 as shown in FIG. 3. The circuit layout card 21 has contact electrodes 212 respectively corresponding to the through holes 12 of the dents 11 of the upper substrate 1. Via the conductive materials 14 in the through holes 12, the contact electrodes 212 respectively electrically contact with the electrodes 41, 42 of the light-emitting diode crystallites 4. In addition, the circuit layout card 21 has multiple connecting sections 213 along the periphery of the lower substrate 2 for connecting with outer side. The circuit layout card 21 further has conductive wires 214 between the contact electrodes 212 and the connecting sections 213. In addition to the circuit layout card 21, other microelectronic cells such as resistors, thermosensors and duplex diodes can be disposed on the surface of the lower substrate 2 for enhancing the function of the entire modularized controlling circuit.

Figure 4:
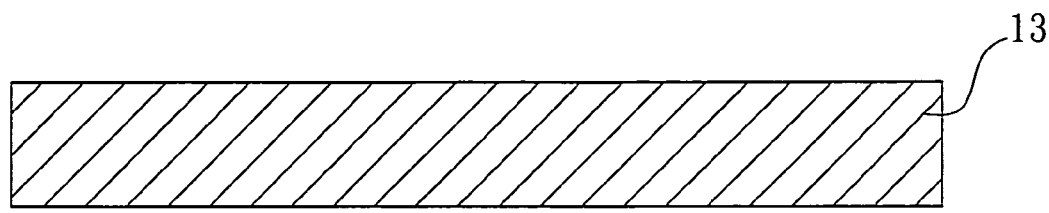
FIG. 4 shows the step of manufacturing upper substrate of the present invention in a first state.
Figure 4A:
FIG. 4A shows the step of manufacturing upper substrate of the present invention in a second state.
Figure 4B:
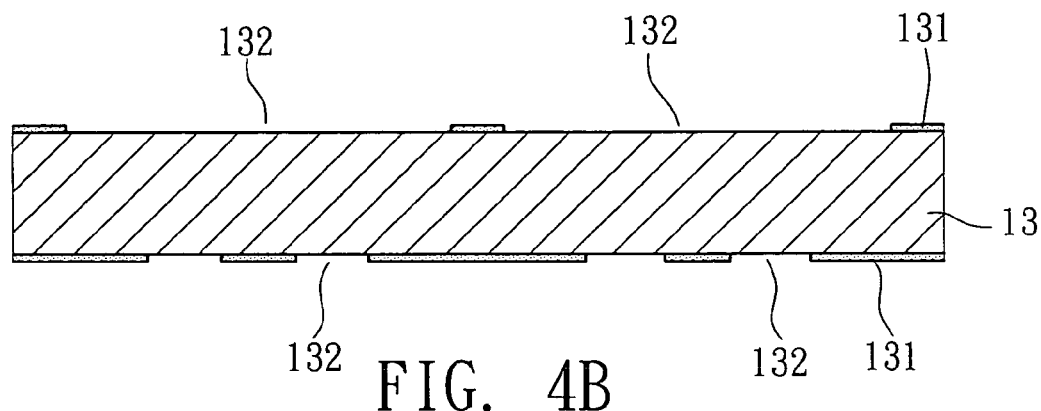
FIG. 4B shows the step of manufacturing upper substrate of the present invention in a third state.
Figure 4C:
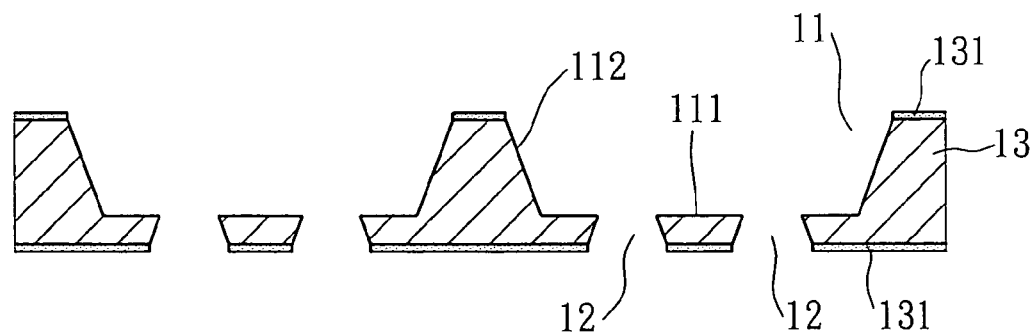
FIG. 4C shows the step of manufacturing upper substrate of the present invention in a fourth state.
Figure 4D:
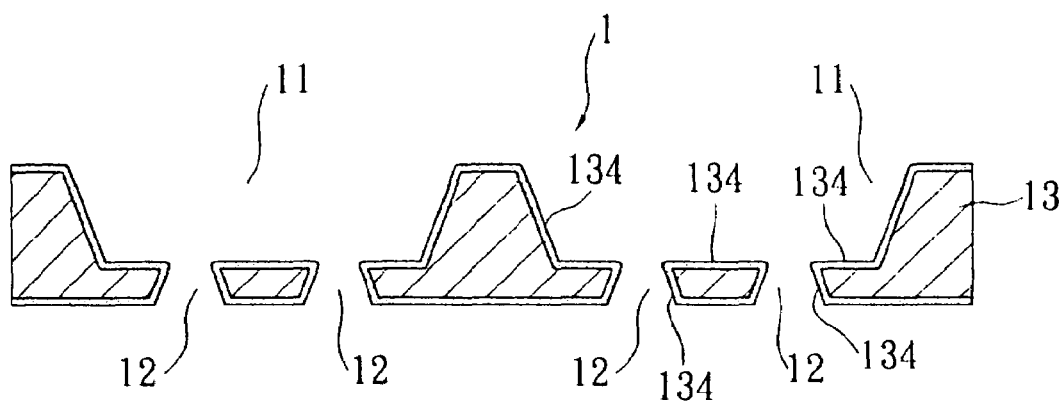
FIG. 4D shows the step of manufacturing upper substrate of the present invention in a fifth state.
Figure 4E:
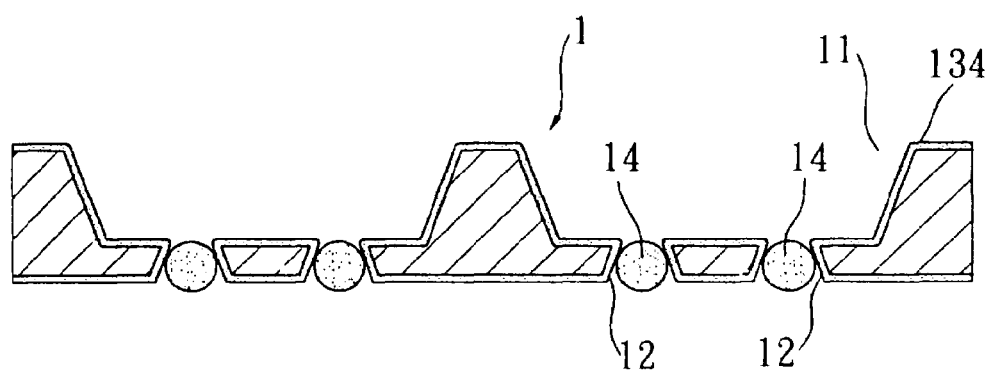
FIG. 4E shows the step of manufacturing upper substrate of the present invention in a sixth state.
Figure 4F:
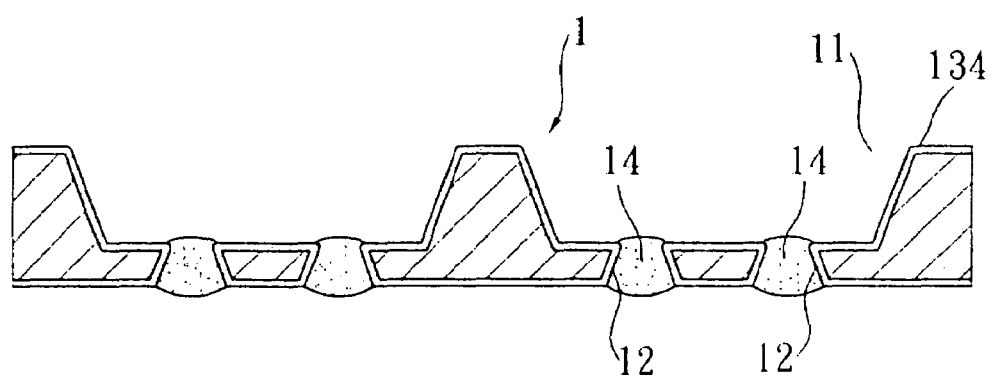
FIG. 4F shows the step of manufacturing upper substrate of the present invention in a seventh state.
Figure 5:
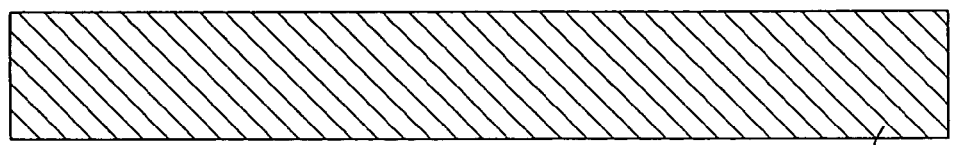
FIG. 5 shows the step of manufacturing lower substrate of the present invention in a first state.
Figure 5A:
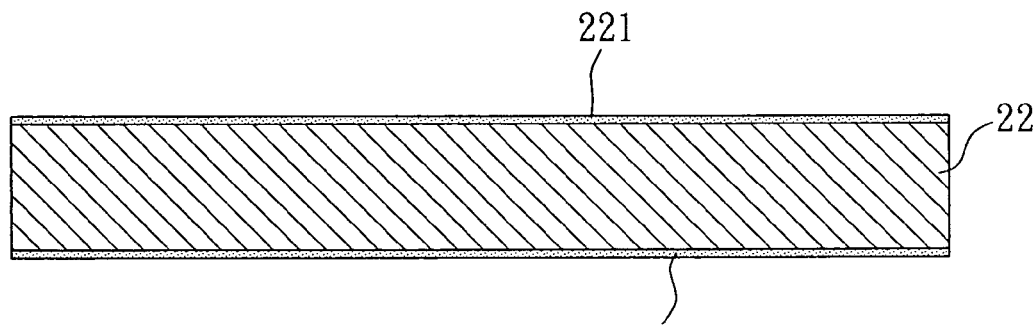
FIG. 5A shows the step of manufacturing lower substrate of the present invention in a second state.
Figure 5B:
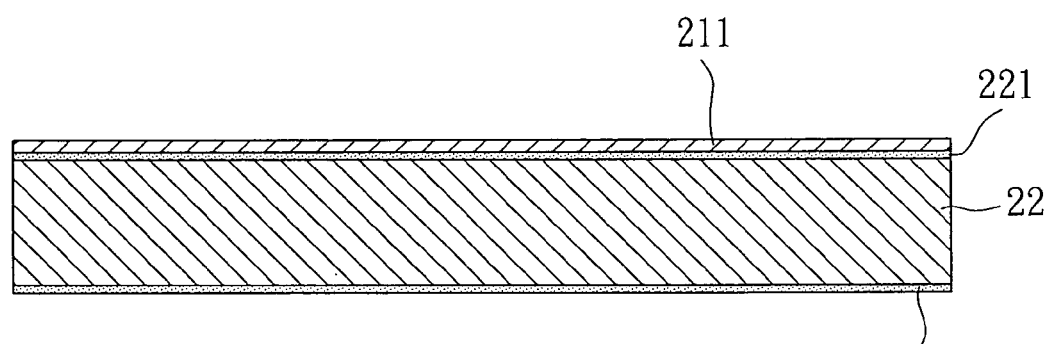
FIG. 5B shows the step of manufacturing lower substrate of the present invention in a third state.
Figure 5C:
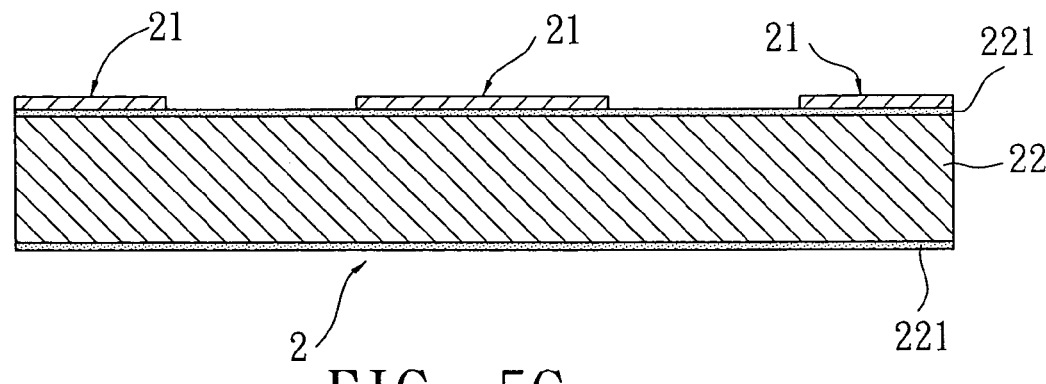
FIG. 5C shows the step of manufacturing lower substrate of the present invention in a fourth state.
Figure 6:
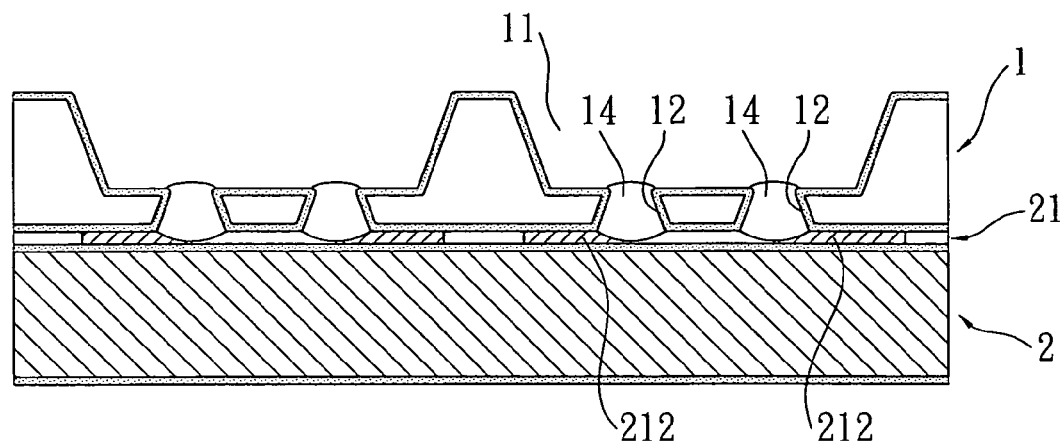
FIG. 6 shows the step of fixing the upper and lower substrates of the present invention.
Figure 7:
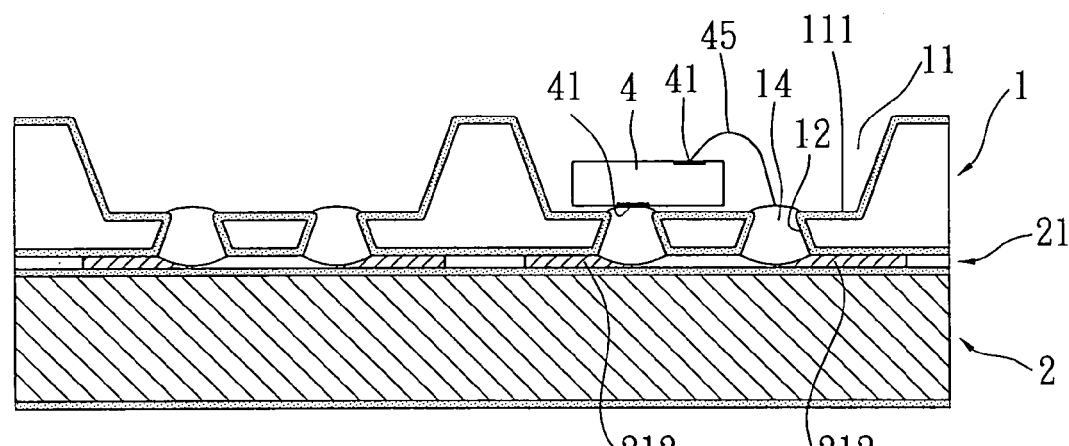
FIG. 7 shows the step of fixing the light-emitting diode crystallite of the present invention.
Figure 8:
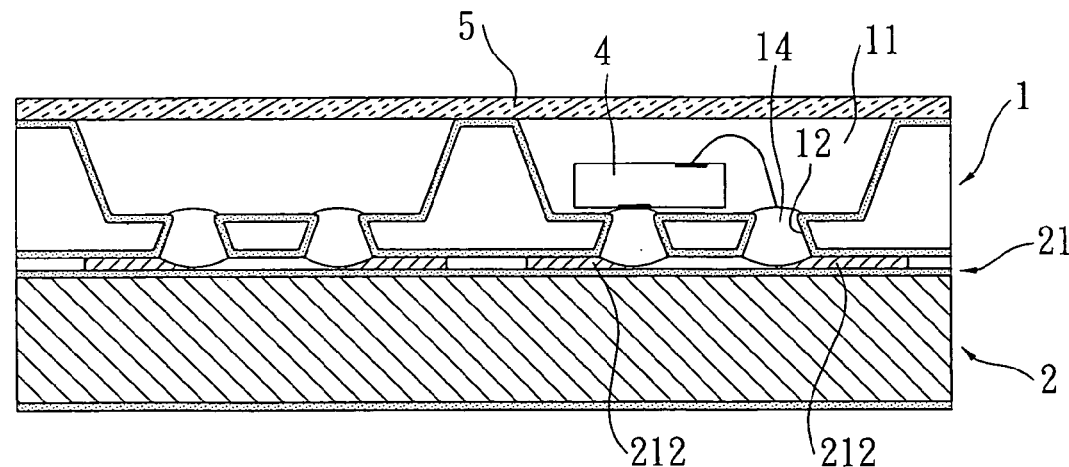
FIG. 8 shows that the dents of the upper substrate are sealed by the protective board of the present invention.
Figure 9:
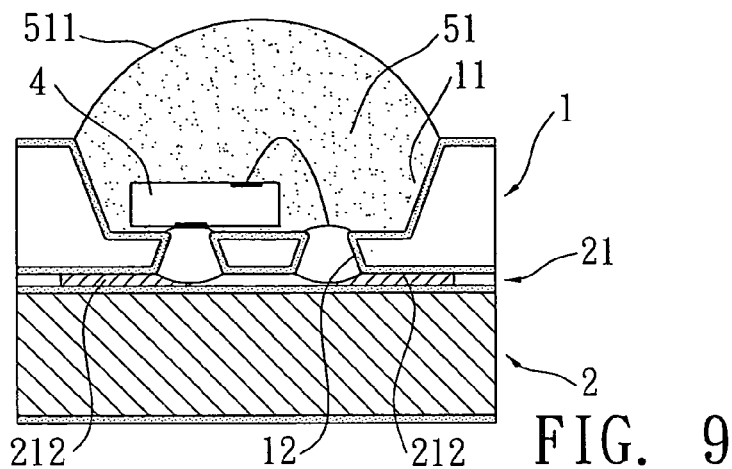
FIG. 9 shows that the dents of the upper substrate are sealed by transparent resin of the present invention.
Figure 10:
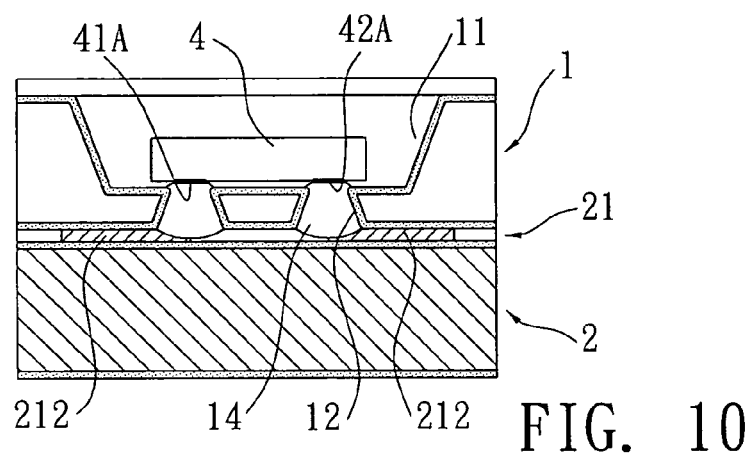
FIG. 10 shows that the light-emitting diode crystallite with two electrodes positioned on the same side is fixed in the dent of the present invention.
Figure 11:
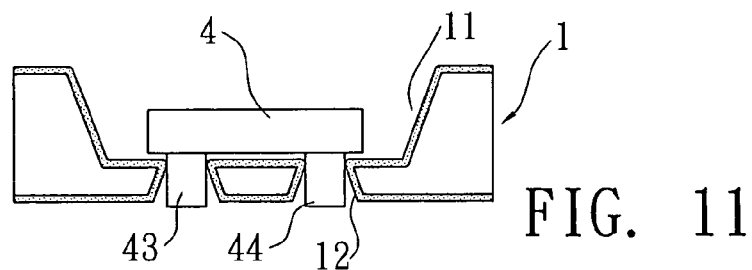
FIG. 11 shows that the conductive materials are used as the electrode pins of the light-emitting diode crystallite of the present invention.
Figure 11A:
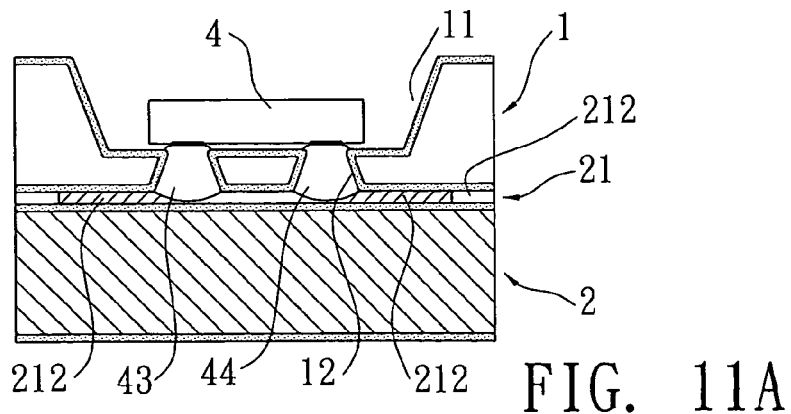
FIG. 11A is a view according to FIG. 11, showing that the electrode pins of the light-emitting diode crystallite of FIG. 11 are electrically connected with the contact electrodes of the lower substrate of the present invention.

According to a preferred embodiment of the present invention, in which one single light-emitting diode crystallite is packaged in each dent, the method for packaging the array-type modularized light-emitting diode structure of the present invention includes steps of:

manufacturing upper substrate, a material with high heat conductivity being selected as the material of the upper substrate, by means of one of molding, injection molding and etching, the upper substrate being made from the material to have multiple arrayed dents 11 and through holes 12, in this embodiment, the upper substrate being made by means of etching, as shown in FIGS. 4 to 4D, a single-crystal silicon chip 13 being selected as the material of the upper substrate 1, the single-crystal silicon chip 13 being placed in a furnace and thermally oxidized to respectively grow two layers of silicon dioxide (or deposit two layers of silicon nitrite) on upper face and lower face of the single-crystal silicon chip 13 as etching-protective layers 131, the etching regions 132 of the upper and lower faces of the single-crystal silicon chip 13 being defined by means of micro-image manufacturing procedure, the protective layers 131 within the etching regions 132 being removed by means of wet etching (BOE) or dry etching (RIE) to expose the etching regions 132 to outer side, then, by means of non-isotropic wet etching (KOH), the etching regions 132 being etched to a certain depth so as to simultaneously form multiple arrayed dents 11 in the single-crystal silicon chip 13 and at the same time form two through holes 12 on the bottom 111 of each dent 11, then, the single-crystal silicon chip 13 with the dents 11 and through holes 12 being placed into the furnace to be heated and thermally oxidized to grow a layer of silicon dioxide (or deposit a layer of silicon nitride) on the surface of each of the dents 11 and through holes 12 as an insulating layer 134;

manufacturing lower substrate, a material with high heat conductivity being selected as the material of the lower substrate, by means of one of halftone printing and micro-image etching, the surface of the lower substrate 2 being formed with a predetermined circuit layout card 21, in this embodiment, as shown in FIGS. 5 to 5C, a single-crystal silicon chip 22 being selected as the material of the lower substrate 2, the single-crystal silicon chip 22 being placed in a furnace, heated and thermally oxidized to respectively grow two layers of silicon dioxide (or deposit two layers of silicon nitride) on upper face and lower face of the single-crystal silicon chip 22 as insulating layers 221, then a metal layer 211 being deposited on the surface of the single-crystal silicon chip 22 by means of vapor deposition (or sputtering) as a substrate layer of the circuit layout card 21, then the regions of the metal layer 211 to be etched for forming the circuit layout card 21 being defined by means of micro-image manufacturing procedure, the metal layer outside the regions being removed by means of etching so as to form the circuit layout card 21 with contact electrodes 212, connecting sections 213 and conductive wires 214 on the surface of the lower substrate 2, in the case that it is desired to further manufacture microelectronic cells necessary for the modularized controlling circuit on the surface of the lower substrate 2, the microelectronic cells being formable by means of CMOS and relevant manufacturing procedures to integrate the cells and combine the system;

fixing the upper and lower substrates with each other, the bottom face of the upper substrate 1 being placed on the upper face of the lower substrate 2 as shown in FIGS. 2, 3 and 6, the through holes 12 of the dents 11 of the upper substrate 1 respectively corresponding to the contact electrodes 212 of the circuit layout card 21 of the lower substrate 2, the connecting sections 213 of the circuit layout card 21 being exposed to the periphery of the upper substrate 1, then the upper and lower substrates 1, 2 being fixed with each other, in this embodiment, the peripheries of the upper and lower substrates 1, 2 in contact with each other being painted with a polymer material such as epoxy and polyimide or other adhesive material 3 such as UV glue to fix the upper and lower substrates 1, 2 with each other, the adhesive material 3 also serving to prevent humidity from infiltrating into the dents 11 of the upper substrate 1;

fixing the light-emitting diode crystallites, multiple light-emitting diode crystallites 4 being respectively fixed on the bottoms 111 of the dents 11 of the upper substrate 1, via the through holes 12 of the bottoms 111 of the dents 11, the electrodes 41, 42 of the light-emitting diode crystallites 4 being electrically connected with the contact electrodes 212 of the circuit layout card 21 of the lower substrate 2, in this embodiment, after forming the insulating layers 134 on the surfaces of the dents 11 and through holes 12 of the upper substrate 1, as shown in FIGS. 4E and 4F, conductive materials 14 such as tin balls (or conductive glue) being respectively implanted into the through holes 12 of the dents 11, in this embodiment, the conductive materials 14 being tin balls, the upper substrate 1 being placed into a baker and heated to soften the tin balls 14 and fill up the through holes 12 with the tin, the tin balls 14 slightly protruding from two ends of the through holes 12 as shown in FIG. 7, whereby when the upper substrate 1 is fixed on the lower substrate 2 and when fixing the light-emitting diode crystallites 4, the tin balls 14 contact with the electrodes 41, 42 of the light-emitting diode crystallites 4 and the contact electrodes 212 of the circuit layout card 21 so as to electrically connect the electrodes 41, 42 of the light-emitting diode crystallites 4 with the contact electrodes 212 of the circuit layout card 21 of the lower substrate 2; and sealing the dents of the upper substrate, the dents 11 of the upper substrate 1 being sealed to prevent the light-emitting diode crystallites 4 from being oxidized, in this embodiment, as shown in FIG. 8, in condition of vacuum or filling of a gas other than air, a protective board 5 such as a transparent glass board or acrylic board with good transparency being fixed on the surface of the upper substrate 1 to cover the same, the protective board 5 serving to isolate the light-emitting diode crystallites 4 from outer environment and protect the light-emitting diode crystallites 4 from being oxidized as well as avoid scatter of the light, an inner face of the protective board 5 being painted with fluorescent agent corresponding to the dents 11 so as to change the color of light emitted from the light-emitting diode crystallites 4, in addition, the inner and outer faces of the protective board 5 being directly formed with convex lenses corresponding to the dents 11 for enhancing light-focusing or light-diverging effect. Alternatively, as shown in FIG. 9, by means of point-gluing, transparent resin 51 can be filled into the dents 11 to protect the light-emitting diode crystallites 4 from being oxidized. Moreover, in order to enhance focusing effect, the transparent resin 51 can be formed with a dome body 511.

The array-type modularized light-emitting diode structure and the packaging method of the present invention are applicable to the light-emitting diode with two electrodes positioned on different sides and the light-emitting diode with two electrodes positioned on the same side. With respect to the light-emitting diode with two electrodes positioned on different sides, in the step of fixing the light-emitting diode crystallites, the bottom electrode 41 of the light-emitting diode crystallite 4 is fixed on a through hole 12 of the dent 11 as shown in FIG. 7 to electrically contact with the conductive material 14 in the through hole 12. The top electrode 42 of the light-emitting diode crystallite 4 via a conductive wire 45 is connected with the conductive material 14 of the other through hole 12. Accordingly, the two electrodes 41, 42 of the light-emitting diode crystallite 4 are electrically connected with the contact electrodes 212 of the circuit layout card 21 of the lower substrate 2.

Figure 12:
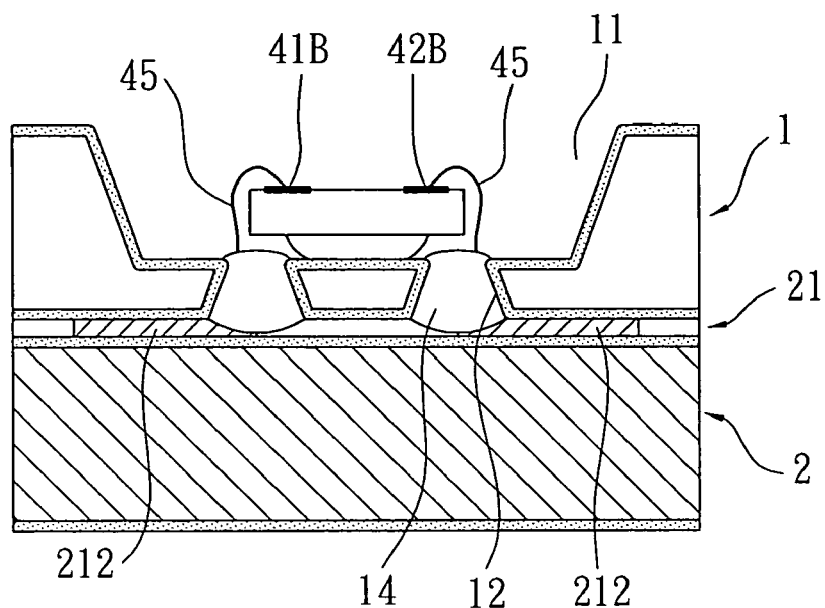
FIG. 12 shows that the light-emitting diode crystallite with two electrodes positioned on the other same side is fixed in the dent of the present invention.

With respect to the light-emitting diode with two electrodes positioned on the same side, in the step of fixing the light-emitting diode crystallites, as shown in FIG. 12, the face of the light-emitting diode crystallite 4 opposite to the two electrodes 41B, 42B is fixed between the through holes 12 of the dent 11. Then the electrodes 41B, 42B on the same side of the light-emitting diode crystallite 4 via conductive wires 45 are connected with the conductive materials 14 in the through holes 12. Accordingly, the two electrodes 41B, 42B of the light-emitting diode crystallite 4 are electrically connected with the contact electrodes 212 of the circuit layout card 21 of the lower substrate 2.

In the step of manufacturing upper substrate, a single-crystal silicon chip is selected as the material of the upper substrate 1 and etched to form the dents 11 by means of KOH. Therefore, the wall 112 of the dent 11 is inclined by an inclination of 54.74 degrees. The dent 11 is tapered for reflecting the light. In addition, a reflective metal layer is deposited on the wall 112 of the dent 11 for enhancing the brightness of the light-emitting diode. A round dent can be formed by means of isotropic etching. This can also achieve light-reflecting effect.

Figure 13:
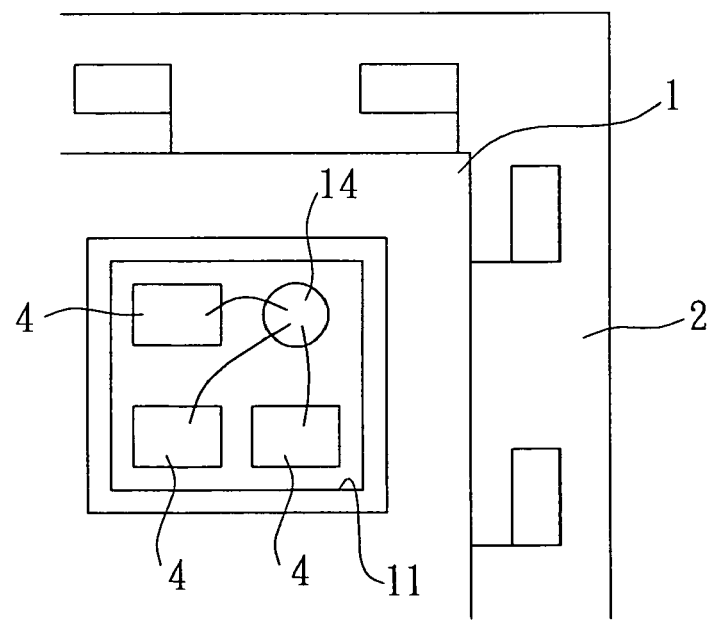
FIG. 13 shows that three light-emitting diode crystallites are disposed in each dent of the present invention.
Figure 14:
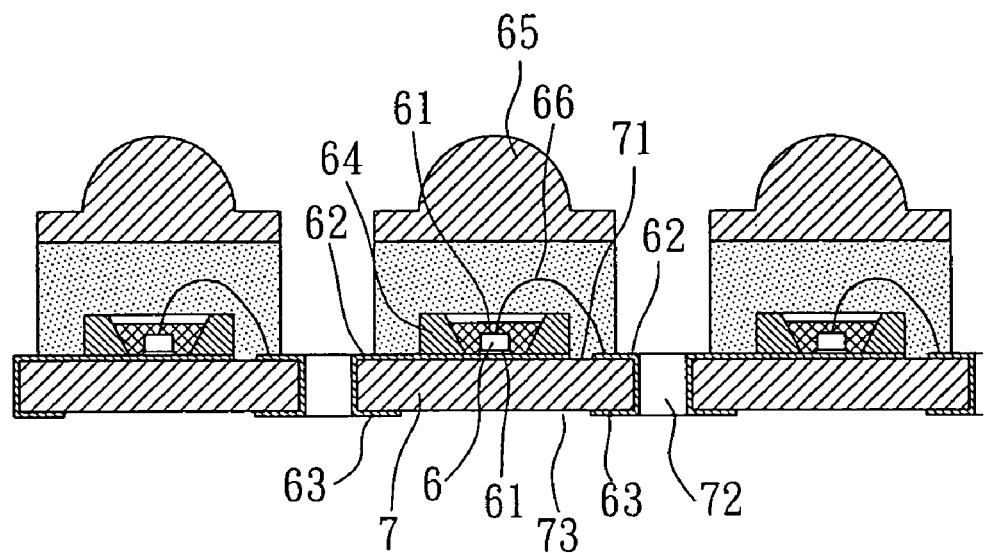
FIG. 14 shows the packaging structure of a conventional light-emitting diode.
Figure 15:
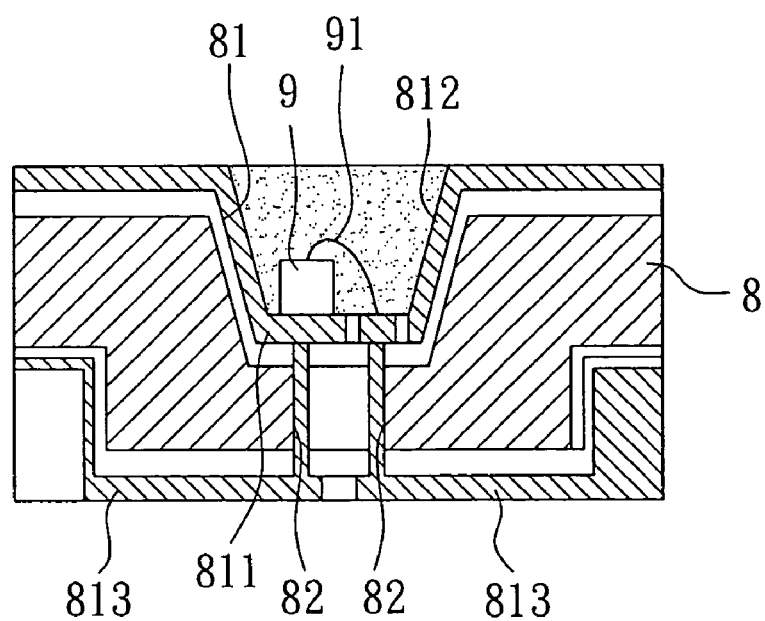
FIG. 15 shows another type of packaging structure of a conventional light-emitting diode.

In the above embodiment, a light-emitting diode is disposed in each dent. Alternatively, more than two light-emitting diode crystallites with red, green and blue colors of light can be disposed in each dent as shown in FIG. 13. Such structure can serve as a backlight source of a liquid crystal display panel.

According to the above arrangement, the array-type modularized light-emitting diode structure and the packaging method of the present invention have the following advantages:

1. The material of the upper and lower substrate is a material with high heat conductivity and the light-emitting diode crystallites are fixed on the bottoms of the dents of the upper substrate. The heat generated by the light-emitting diode crystallites can dissipate from the upper and lower substrates so that the heat-dissipating effect is better. Accordingly, the lighting efficiency of the light-emitting diode can be enhanced.

2. Multiple light-emitting diodes are arrayed and modularized so that the present invention is applicable to those products necessitating modularized light-emitting diodes, such as car headlight, traffic sign and liquid crystal display panel. Moreover, via the circuit layout card of the lower-substrate, the electrodes of the light-emitting diodes are guided to the periphery of the lower substrate for easily manufacturing the leads for connecting with outer side. This facilitates the successive packaging of the entire module.

3. In the step of manufacturing upper and lower substrates, the single-crystal silicon chip is used as the substrate board. Therefore, in cooperation with CMOS manufacturing procedure, a high-density modularized product can be manufactured. In addition, mass-production becomes possible so that the manufacturing cost can be greatly reduced.

4. In the step of manufacturing upper and lower substrates, the through holes are formed by means of etching and the internal conductive wires are made by means of melting tin balls (or filling conductive glue). Therefore, the steps of the manufacturing procedure are reduced and simplified. Accordingly, the ratio of good products is increased and the manufacturing cost is lowered.

5. In the step of manufacturing upper and lower substrates, the single-crystal silicon chip is used as the substrate board. In comparison with other nonmetal material, the silicon chip has higher heat conductivity. Moreover, with the silicon chip serving as the substrate board, the mechanical properties of the silicon chip are close to those of the material of the light-emitting diode so that the thermal stress damage of the cells caused by temperature effect can be reduced in use of the entire module.

6. In the step of sealing the dents of the upper substrate, all the dents can be sealed at one time by one single piece of glass. Therefore, the manufacturing procedure is simplified. Moreover, the fluorescent agent painted on the back face of the glass can change the color of the light emitted by the light-emitting diode.

The above embodiments are only used to illustrate the present invention, not intended to limit the scope thereof. Many modifications of the above embodiments can be made without departing from the spirit of the present invention.

What is claimed is:

1. A method for packaging an array-type modularized light-emitting diode structure, comprising steps of:

manufacturing an upper substrate, a material with high heat conductivity being selected as the material of the upper substrate, by means of one of molding, injection molding and etching, the upper substrate being made from the material to have multiple arrayed dents and at least two through holes passing though the bottom of each dent, a conductive material being implanted in each though hole;

manufacturing a lower substrate, a material with high heat conductivity being selected as the material of the lower substrate, by means of one of halftone printing and etching, a surface of the lower substrate being formed with a predetermined circuit layout card, the circuit layout card having multiple contact electrodes and multiple connecting sections along a periphery of the lower substrate for connecting with outer side, the circuit layout card further having conductive wires between the contact electrodes and the connecting sections;

fixing the upper and lower substrates with each other, the bottom face of the upper substrate being placed on the upper face of the lower substrate with the through holes of the dents of the upper substrate respectively corresponding to the contact electrodes of the circuit layout card of the lower substrate, the connecting sections of the circuit layout card being exposed to the periphery of the upper substrate, then the upper and lower substrates being fixed with each other;

fixing light-emitting diode crystallites, multiple light-emitting diode crystallites being respectively fixed on the bottoms of the dents of the upper substrate, via the through holes of the bottoms of the dents, the electrodes of the light-emitting diode crystallites being electrically connected with the contact electrodes of the circuit layout card of the lower substrate; and sealing the dents of the upper substrate, the dents of the upper substrate being sealed to prevent the light-emitting diode crystallites from being oxidized.

wherein in the step of manufacturing the upper substrate, the upper substrate is made by means of etching, a single-crystal silicon chip being selected as the material of the upper substrate, the single-crystal silicon chip being placed in a furnace and heated to respectively form two etching-protective layers on upper face and lower face of the single-crystal silicon chip, the etching regions of the dents and through holes of the upper and lower faces of the single-crystal silicon chip being defined by means of micro-image manufacturing procedure, the protective layers of the etching regions being removed by means of etching to expose the etching regions to outer side, then, by means of non-isotropic wet etching, the etching regions being etched to a certain depth so as to simultaneously form multiple arrayed dents in the single-crystal silicon chip and at the same time form two through holes on the bottom of each dent, then, the single-crystal silicon chip etched with the dents and through holes being placed into the furnace and heated to form an insulating layer on the surface of each of the dents and through holes, a tin ball being implanted into each through hole and then the upper substrate being placed into a baker and heated to soften the tin ball and fill up the through hole with the tin ball.

2. The method for packaging an array-type modularized light-emitting diode structure as claimed in claim 1, wherein in the step of sealing the dents of the upper substrate, by vacuum, a protective board with good transparency being fixed on the surface of the upper substrate to cover the upper substrate and isolate the light-emitting diode crystallites from outer environment.

3. A method for packaging an array-type modularized light-emitting diode structure, comprising steps of:

manufacturing an upper substrate, a material with high heat conductivity being selected as the material of the upper substrate, by means of one of molding, injection molding and etching, the upper substrate being made from the material to have multiple arrayed dents and at least two through holes passing through the bottom of each dent, a conductive material being implanted in each through hole;

manufacturing a lower substrate, a material with high heat conductivity being selected as the material of the lower substrate, by means of one of halftone printing and etching, a surface of the lower substrate being formed with a predetermined circuit layout card, the circuit layout card having multiple contact electrodes and multiple connecting sections along a periphery of the lower substrate for connecting with outer side, the circuit layout card further having conductive wires between the contact electrodes and the connecting sections;

fixing the upper and lower substrates with each other, the bottom face of the upper substrate being placed on the upper face of the lower substrate with the through holes of the dents of the upper substrate respectively corresponding to the contact electrodes of the circuit layout card of the lower substrate, the connecting sections of the circuit layout card being exposed to the periphery of the upper substrate, then the upper and lower substrates being fixed with each other;

fixing light-emitting diode crystallites, multiple light-emitting diode crystallites being respectively fixed on the bottoms of the dents of the upper substrate, via the through holes of the bottoms of the dents, the electrodes of the light-emitting diode crystallites being electrically connected with the contact electrodes of the circuit layout card of the lower substrate; and sealing the dents of the upper substrate, the dents of the upper substrate being sealed to prevent the light-emitting diode crystallites from being oxidized.

wherein in the step of manufacturing the lower substrate, a single-crystal silicon chip is selected as the material of the lower substrate, the single-crystal silicon chip being placed in a furnace and heated to respectively form two insulating layers on upper face and lower face of the single-crystal silicon chip, then a metal layer being deposited on the upper face of the single-crystal silicon chip by means of vapor deposition as a substrate layer of the circuit layout card, then the regions of the metal layer to be etched for forming the circuit layout card being defined by means of micro-image manufacturing procedure, the metal layer outside the regions being removed by means of etching so as to form the circuit layout card with the contact electrodes, connecting sections and conductive wires on the upper face of the lower substrate.

\* \* \* \* \*